(12) United States Patent
Dwelley et al.

(10) Patent No.: US 6,404,251 B1
(45) Date of Patent: Jun. 11, 2002

(54) SYSTEMS AND METHODS FOR LINEARLY VARYING A PULSE-WIDTH MODULATION SIGNAL WITH A CONTROL SIGNAL

(75) Inventors: David M. Dwelley, Fremont; Trevor W. Barcelo, Mountain View, both of CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/536,271

(22) Filed: Mar. 27, 2000

(51) Int. Cl.[7] ............................................... H03K 3/017
(52) U.S. Cl. ...................................................... 327/172
(58) Field of Search ................................ 327/172–176, 327/100, 124, 129, 131

(56) References Cited

U.S. PATENT DOCUMENTS

| | | | | |
|---|---|---|---|---|
| 4,404,481 A | * | 9/1983 | Ide et al. | 327/100 |
| 5,990,753 A | * | 11/1999 | Danstrom et al. | 327/175 |
| 6,078,208 A | * | 6/2000 | Nolan et al. | 327/512 |

FOREIGN PATENT DOCUMENTS

GB   1253670   11/1971

* cited by examiner

*Primary Examiner*—Kenneth B. Wells
(74) *Attorney, Agent, or Firm*—Fish & Neave; Robert W. Morris; Kevin T. Roddy

(57) ABSTRACT

A linear pulse-width modulator system is provided. The pulse-width modulation system of the present invention provides a pulse-width modulated (PWM) signal from a control voltage. The PWM signal varies linearly with the control voltage over a full range of duty cycles. The pulse width modulation system of the present invention has as plurality of comparators, each having one input coupled to a control voltage and a second input coupled to a periodic waveform signal provide by a waveform generator. The periodic waveform signals are identical except that each waveform is time delayed with respect to the other waveform signals. The outputs the comparators are coupled to a multiplexer which selects the output of each comparator as the PWM signal for a time interval corresponding to when the output signal of the comparator has substantially constant propagation delays. The propagation delays in the a comparator's output signal are substantially constant when the periodic waveform signal input of the comparator is not near the its minimum or maximum voltage.

43 Claims, 8 Drawing Sheets

US 6,404,251 B1

SYSTEMS AND METHODS FOR LINEARLY VARYING A PULSE-WIDTH MODULATION SIGNAL WITH A CONTROL SIGNAL

BACKGROUND OF THE INVENTION

This invention relates to pulse-width modulation systems. More specifically, this invention relates to linear pulse width modulation systems that provide a pulse-width modulated (PWM) signal that has a duty cycle from 0–100% that varies linearly with a control voltage signal.

A pulse-width modulator is a circuit that generates a PWM signal from a DC control voltage and a periodic analog waveform such as a triangular waveform. A previously known pulse width modulator 10 is shown in FIG. 1. Pulse-width modulator 10 comprises comparator 14 that compares a control voltage $V_C$ at its non-inverting input to periodic analog waveform signal $V_W$ generated by waveform generator 12 at its inverting input to generate PWM signal $V_{PWM}$. The comparator provides $V_{PWM}$ that alternates between LOW (e.g., 0 volts) and HIGH (e.g., 5 volts) in response to the voltage difference between the inverting and non-inverting inputs.

A PWM signal is a periodic signal that has an amplitude that alternates between LOW and HIGH, and has a duty cycle of between 0–100%. The period of $V_{PWM}$ is set by the period of $V_W$. The duty cycle of $V_{PWM}$ is typically defined as the percentage of time that $V_{PWM}$ is HIGH during its period. The duty cycle of $V_{PWM}$ is set by the value of $V_C$, and varies based on changes in $V_C$.

Many applications require pulse-width modulators that provide a PWM signal having a duty cycle that varies linearly with the control voltage over the entire range of duty cycles from 0% to 100%. The duty cycle of the PWM signal may vary non-linearly with $V_C$ when the output signal of the comparator in the pulse-width modulator has varying propagation delays. The propagation delay of comparator 14 is the time required for its output signal ($V_{PWM}$) to reach the midpoint between the LOW and HIGH values from the time when the voltage difference between the non-inverting and inverting inputs passes through zero. There are two distinct propagation delays: $t_{PLH}$ is the propagation delay when $V_{PWM}$ transitions from LOW to HIGH, and $t_{PHL}$ is the propagation delay when $V_{PWM}$ transitions from HIGH to LOW.

Example of signals $V_W$, $V_C$, and $V_{PWM}$ for circuit 10 are shown in FIG. 2. $V_W$ varies between $V_{MAX}$ and $V_{MIN}$, and $V_{PWM}$ has two states (HIGH and LOW). Ideally, $V_{PWM}$ is HIGH when $V_C > V_W$, and $V_{PWM}$ is LOW when $V_C < V_W$. In reality, however, comparator 14 has non-zero propagation delays $t_{PHL}$ 20 and $t_{PLH}$ 22. In particular, $t_{PHL}$ 20 is the difference between the time when $V_W$ crosses from just below to just above $V_C$ and the time when $V_{PWM}$ reaches the midpoint between HIGH and LOW, and $t_{PLH}$ 22 is the difference between the time when $V_W$ crosses from just above to just below $V_C$ and the time when $V_{PWM}$ reaches the midpoint between LOW and HIGH.

Propagation delays $t_{PHL}$ and $t_{PLH}$ may vary as $V_C$ varies between $V_{MAX}$ and $V_{MIN}$ due to variations in the overdrive (i.e., the magnitude of the difference between the voltages at the non-inverting and inverting inputs of the comparator), and the finite slew rate of the comparator's internal nodes. For example, $t_{PLH}$ increases and $t_{PHL}$ decreases as $V_C$ approaches $V_{MIN}$, and $t_{PLH}$ decreases and $t_{PHL}$ increases as $V_C$ approaches $V_{MAX}$.

FIG. 3 is a graph of the duty cycle of signal $V_{PWM}$ of circuit 10 where $V_W$ is a symmetrical triangular periodic waveform signal. The peak-to-peak amplitude of $V_W$ is its maximum voltage $V_{MAX}$ minus its minimum voltage $V_{MIN}$. Control voltage $V_C$ varies between $V_{MAX}$ and $V_{MIN}$ causing the duty cycle of $V_{PWM}$ to vary between 100% and 0%. Variations in propagation delays $t_{PHL}$ and $t_{PLH}$ of comparator 14 cause non-linearity 38 in $V_{PWM}$ near 100% duty cycle when $V_C$ is near $V_{MAX}$ (e.g. when $V_C$ is greater than 80% of the peak-to-peak amplitude of $V_W$), and non-linearity 39 in $V_{PWM}$ near 0% duty cycle when $V_C$ is near $V_{MIN}$ (e.g. when $V_C$ is less than 20% of the peak-to-peak amplitude of $V_W$). Non-linearities in $V_{PWM}$ near 100% and 0% duty cycles also exist in pulse-width modulators that use asymmetrical sawtooth periodic waveforms.

A high speed comparator may be used to achieve a more linear relationship between $V_C$ and the duty cycle of $V_{PWM}$. The duty cycle of the PWM signal output of a high speed comparator used in a pulse-width modulator is able to approach closer to 0% and 100% before propagation delay variations cause non-linearities in the relationship between $V_C$ and $V_{PWM}$. High speed comparators, however, typically require significantly more power and more complex circuitry than a standard comparator.

It would, however, be desirable to provide a pulse width modulator that has substantially constant propagation delays over a full range of duty cycles without significantly added power consumption and complex circuitry.

SUMMARY OF THE INVENTION

It is therefore an object of the invention to provide a pulse width modulator that has substantially constant propagation delays over a full range of duty cycles without significantly added power consumption and complex circuitry.

These and other objects of the present invention are provided by a pulse width modulator that includes a plurality of comparators, a multiplexer, and at least one waveform generator that generates a plurality of periodic waveform signals. Each of the plurality of comparators monitors control voltage $V_C$ and compares it to one of the periodic waveform signals. Each of the periodic waveform signals is time delayed with respect to the other waveform signals.

The outputs of the comparators are coupled to inputs of the multiplexer. The multiplexer selects the output signal of one of the comparators to be the PWM signal when the periodic waveform signal input to that comparator is not near its maximum or minimum voltage. During this time interval, transitions in the output signal of the selected comparator have substantially constant propagation delays.

Because each periodic waveform is time delayed with respect to the other periodic waveforms, the output of only one comparator is selected as the PWM signal during each cycle of the PWM signal. By using multiple comparators and periodic waveforms, the multiplexer is able to "stitch together" a composite PWM signal that uses the output signal of each comparator only when that comparator has substantially constant propagation delays. Low speed, low power comparators may be used in the present invention to achieve a PWM signal with a duty cycle that varies linearly with the control voltage over a full range of duty cycles. The present invention also provides methods for generating a PWM signal with a duty cycle that varies linearly with the control voltage over a full range of duty cycles.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE PREFERRED EMBODIMENT

Figure 1:
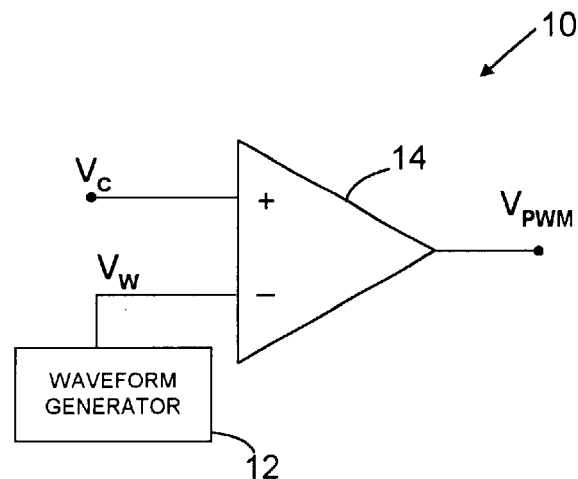
FIG. 1 is a block diagram of a prior art pulse-width modulator.
Figure 2:
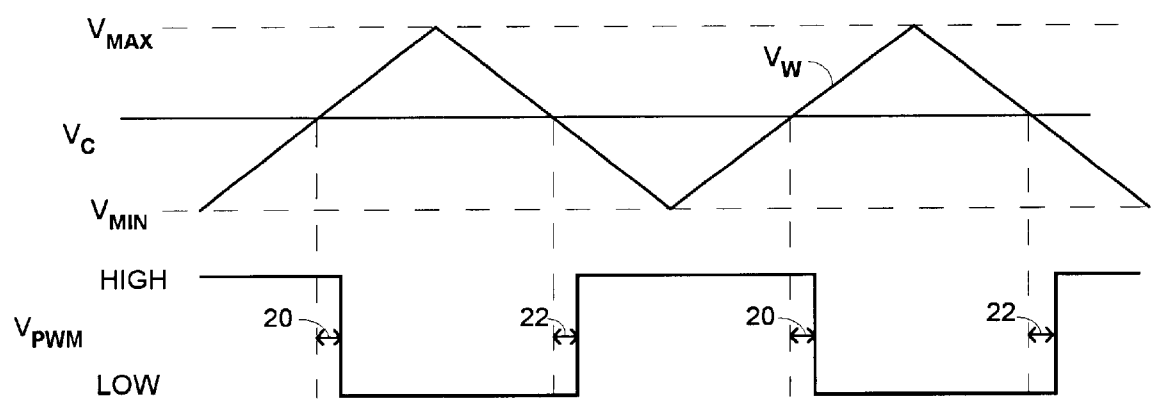
FIG. 2 is a timing diagram of signals of the prior art circuit of FIG. 1.
Figure 3:
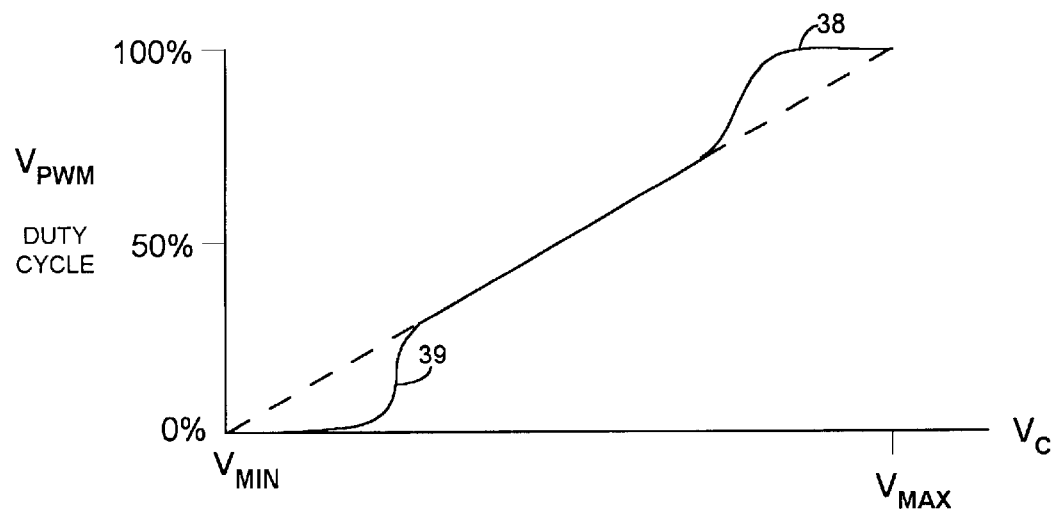
FIG. 3 is a timing diagram of the duty cycle transfer function of a PWM signal of the prior art circuit of FIG. 1.
Figure 4A:
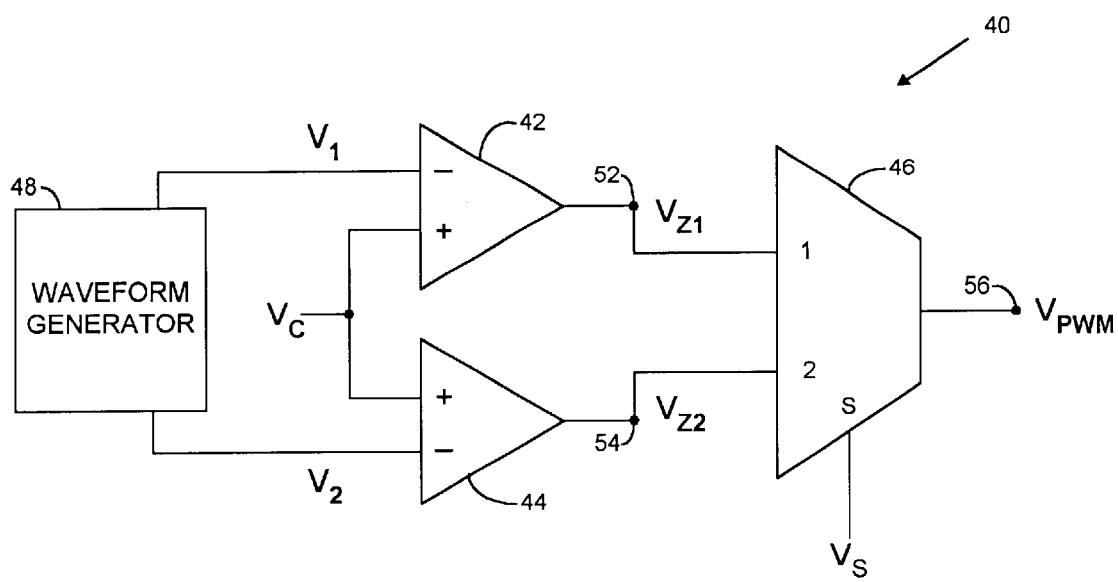
FIG. 4A is a block diagram of an illustrative embodiment of pulse width modulators of the present invention.

An embodiment of the linear pulse width modulation system of the present invention is shown as circuit 40 in FIG. 4A. Circuit 40 generates PWM signal $V_{PWM}$ from control voltage signal $V_C$. The duty cycle of signal $V_{PWM}$ varies linearly with control voltage $V_C$.

Circuit 40 (which may be an integrated circuit) includes waveform generator 48, comparators 42 and 44, and multiplexer 46. Waveform generator 48 provides periodic waveforms $V_1$ and $V_2$, which are coupled to the inverting inputs of comparators 42 and 44, respectively. The non-inverting inputs of comparators 42 and 44 are coupled to control voltage $V_C$. Comparator 42 generates signal $V_{Z1}$ at node 52 which is coupled to a first input of multiplexer 46. Comparator 44 generates signal $V_{Z2}$ at node 54 which is coupled to a second input of multiplexer 46. Select signal $V_S$ is coupled to the S input of multiplexer 46. Multiplexer 46 provides output signal $V_{PWM}$ at node 56.

Figure 4B:
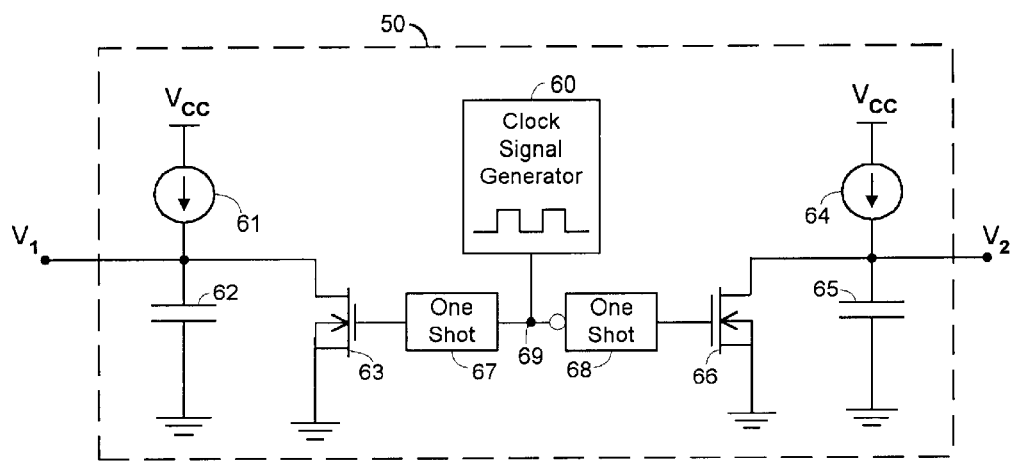
FIG. 4B is a schematic diagram of an illustrative waveform generator of FIG. 4A.
Figure 5:
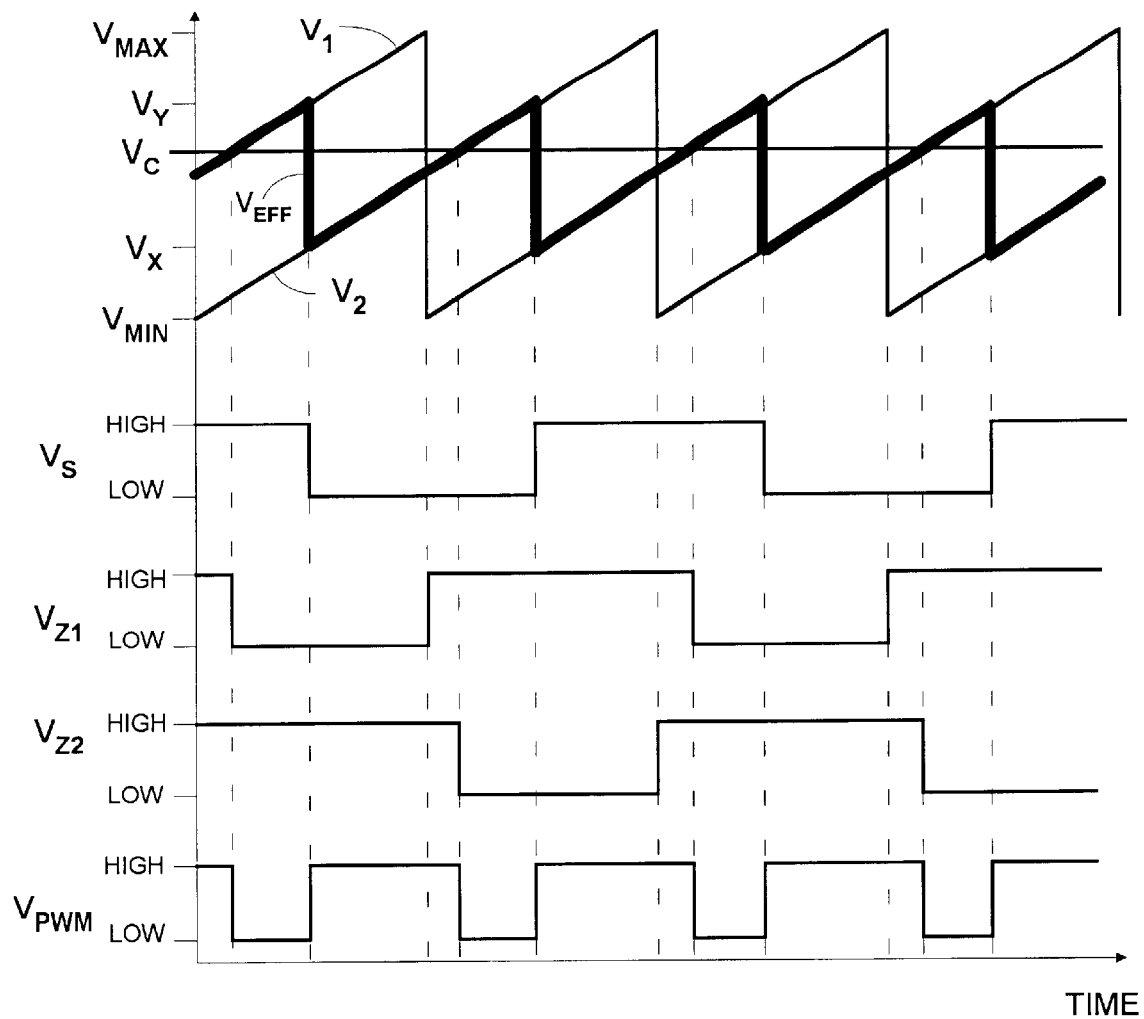
FIG. 5 is a timing diagram of exemplary signals for the circuitry of FIG. 4A.

Examples of signals $V_1$, $V_2$, $V_C$, $V_S$, $V_{Z1}$, $V_{Z2}$, and $V_{PWM}$ are shown in FIG. 5. $V_1$ and $V_2$ are, in this example, asymmetrical rising edge sawtooth waveform signals with rapidly falling edges that vary between $V_{MAX}$ and $V_{MIN}$. Waveform signals $V_1$ and $V_2$ have the same wave shape and the same frequency, but are 180° apart in phase. Waveform generator 48 may also generate sawtooth waveforms with rapidly rising edges, or sawtooth waveforms with non-rapidly rising and falling edges. Waveform generator 50 in FIG. 4B is one possible example of waveform generator 48. Waveform generator 50 generates example sawtooth waveform signals $V_1$ and $V_2$ with rapidly falling edges as shown in FIG. 5.

Waveform generator 50 includes clock signal generator 60, constant current sources 61 and 64, capacitors 62 and 65, n-channel MOS field effect transistors 63 and 66, and one shots 67 and 68. Constant current source 61 has a first terminal coupled to supply voltage $V_{CC}$ and a second terminal coupled to a first terminal of capacitor 62, a drain of transistor 63, and $V_1$. Capacitor 62 has a second terminal coupled to GROUND, and transistor 63 has a source coupled to GROUND. Constant current source 64 has a first terminal coupled to supply voltage $V_{CC}$ and a second terminal coupled to a first terminal of capacitor 65, a drain of transistor 66, and $V_2$. Capacitor 65 has a second terminal coupled to GROUND, and transistor 66 has a source coupled to GROUND. Clock signal generator 60 has an output terminal coupled to input terminals of one shots 67 and 68 at node 69. One shot 67 has an output coupled to the gate of transistor 63, and one shot 68 has an output coupled to the gate of transistor 66.

Clock signal generator 60 generates a square wave digital clock signal with a 50% duty cycle that alternates between HIGH and LOW at node 69. During each cycle of the clock signal, constant current source 61 charges up capacitor 62 from $V_{MIN}$ to $V_{MAX}$ and constant current source 64 charges up capacitor 65 from $V_{MIN}$ to $V_{MAX}$. When the clock signal goes HIGH, the signal at the output of one shot 67 goes from LOW to HIGH turning ON transistor 63. The voltage on capacitor 62 at $V_1$ then falls from $V_{MAX}$ to $V_{MIN}$. The output of one shot 67 remains HIGH only for a brief period of time (e.g., 1% of the time that the clock signal at node 69 remains HIGH). The output of one shot 67 then transitions LOW and transistor 63 turns OFF. Constant current source 61 then begins to charge up capacitor 62 to $V_{MAX}$ again. The output of one shot 67 remains LOW until the next rising edge of the clock signal.

When the clock signal goes LOW, the signal at the output of one shot 68 goes from LOW to HIGH turning on transistor 66. The voltage on capacitor 65 at $V_2$ then falls from $V_{MAX}$ to $V_{MIN}$. The output of one shot 68 remains HIGH only for a brief period of time (e.g., 1% of the time that the clock signal at node 69 remains LOW). The output of one shot 68 then transitions LOW and transistor 66 turns OFF. Constant current source 64 now begins charging up capacitor 65 to $V_{MAX}$ again. The output of one shot 68 remains LOW until the next falling edge of the clock signal.

Select signal $V_S$ is, for example, a digital signal that has an amplitude that has two states (i.e., HIGH or LOW) as shown in FIG. 5. Signal $V_S$ controls which signal ($V_{Z1}$ or $V_{Z2}$) that multiplexer 46 selects as $V_{PWM}$. Signal $V_S$ causes multiplexer 46 to select $V_{Z1}$ as $V_{PWM}$ when $V_S$ is HIGH, and $V_{Z2}$ as $V_{PWM}$ when $V_S$ is LOW.

$V_Y$ is the value of $V_1$ when $V_S$ transitions from HIGH to LOW, and the value of $V_2$ when $V_S$ transitions from LOW to HIGH. $V_X$ is the value of $V_1$ when $V_S$ transitions from LOW to HIGH, and the value of $V_2$ when $V_S$ transitions from HIGH to LOW. Circuit 40 causes the duty cycle of $V_{PWM}$ to vary between 0% and 100% as $V_C$ varies between $V_X$ and $V_Y$.

Multiplexer 46 couples the signal at input node 52 or the signal at input node 54 to output node 56 as a function of select signal $V_S$. For example, when $V_S$ is HIGH, multiplexer 46 couples the output of comparator 42 to output node 56 as $V_{PWM}$, and when $V_S$ is LOW, multiplexer 46 couples the output of comparator 44 to output node 56 as $V_{PWM}$. Multiplexer 46 alternately couples the output signals of comparators 42 and 44 to node 56 as $V_{PWM}$ for consecutive time intervals. In one cycle of $V_S$, $V_{PWM}$ equals the output signal of comparator 42 ($V_{Z1}$) for a first time interval, and then $V_{PWM}$ equals output signal of comparator 44 ($V_{Z2}$) for a second subsequent time interval. This cycle of $V_S$ repeats periodically. Each time interval during which an output of comparator 42 or 44 is coupled to node 56 corresponds to one cycle of $V_{PWM}$.

Signal $V_S$ selects $V_{Z1}$ to be $V_{PWM}$ when comparator 42 is in a region of operation when $V_1$ is between $V_X$ and $V_Y$, and selects $V_{Z2}$ to be $V_{PWM}$ when comparator 44 is in a region of operation when $V_2$ is between $V_X$ and $V_Y$. Signal $V_S$ preferably does not select $V_{Z1}$ to be $V_{PWM}$ during periods of time when comparator 42 has varying propagation delays $t_{PHL}$ and $t_{PLH}$. The propagation delays of comparator 42 may vary when $V_1$ crosses $V_C$ below $V_X$ or above $V_Y$. Signal $V_S$ preferably does not select $V_{Z2}$ to be $V_{PWM}$ during periods of time when comparator 44 has varying propagation delays $t_{PHL}$ and $t_{PLH}$. The propagation delays of comparator 44 may vary when $V_2$ crosses $V_C$ below $V_X$ or above $V_Y$.

Only variations in $V_C$ between $V_X$ and $V_Y$ are used to vary the duty cycle of $V_{PWM}$, because the propagation delays of comparators 42 and 44 may not be substantially constant with respect to each other when $V_C$ is less than $V_X$ or greater than $V_Y$. Circuit 40 provides $V_{PWM}$ that has a duty cycle that varies linearly with $V_C$ by only using the output signals of comparators 42 and 44 during periods of time when their propagation delays $t_{PHL}$ and $t_{PLH}$ are substantially constant.

FIG. 5 illustrates signal waveforms of circuit 40 with $V_1$ and $V_2$ as rapidly falling edge sawtooth waveforms. On the rising edge of $V_S$, $V_1$ equals $V_X$ and is rising, and $V_2$ equals $V_Y$ and is rising. When $V_S$ is HIGH, $V_1$ ramps up from $V_X$ to $V_Y$, and multiplexer 46 selects $V_{Z1}$ as $V_{PWM}$. On the falling edge of $V_S$, $V_2$ equals $V_X$ and is rising, and $V_1$ equals $V_Y$ and is rising. When $V_S$ is LOW, $V_2$ ramps up from $V_X$ to $V_Y$, and multiplexer 46 selects $V_{Z2}$ as $V_{PWM}$. Comparators 42 and 44 of circuit 40 may have propagation delays $t_{PHL}$ and $t_{PLH}$ that vary if their corresponding input waveform signals $V_1$ and $V_2$ cross $V_C$ below $V_X$ or above $V_Y$, because the output signals of comparators 42 and 44 are not used to form $V_{PWM}$ during these time periods.

FIG. 5 also shows waveform $V_{EFF}$, which is an effective waveform comprised of portions of $V_1$ and $V_2$ used to generate $V_{PWM}$. $V_{PWM}$ is LOW when the waveform $V_{EFF}$ is above $V_C$, and $V_{PWM}$ is HIGH when waveform $V_{EFF}$ is below $V_C$. Thus, $V_{PWM}$ transitions LOW when $V_1$ or $V_2$ ramps up above $V_C$. $V_{PWM}$ transitions HIGH when $V_S$ transitions from LOW to HIGH or from HIGH to LOW.

In the example of FIG. 5, comparator 42 is preferably selected so that it has substantially constant propagation delays $t_{PHL}$ when $V_C$ is between $V_X$ and $V_Y$, and comparator 44 is preferably selected so that it has substantially constant propagation delays $t_{PHL}$ when $V_C$ is between $V_X$ and $V_Y$. Comparator 42 has a region of operation when $V_1$ and $V_C$ are between $V_X$ and $V_Y$ in which $t_{PHL}$ is substantially constant since the HIGH to LOW transitions in $V_{Z1}$ are used to form $V_{PWM}$ in the example of FIG. 5. Comparator 44 has a region of operation when $V_2$ and $V_C$ are between $V_X$ and $V_Y$ in which $t_{PHL}$ is substantially constant since the HIGH to LOW transitions in $V_{Z2}$ are also used to form $V_{PWM}$ in the example of FIG. 5. Propagation delays $t_{PLH}$ of comparators 42 and 44 do not need to be substantially constant between $V_X$ and $V_Y$ in the example of FIG. 5 because the LOW to HIGH transitions in $V_{Z1}$ and $V_{Z2}$ are not used to form $V_{PWM}$. However, $V_{Z1}$ should transition from LOW to HIGH before $V_{Z1}$ is selected by multiplexer 46 as $V_{PWM}$ (when $V_1$ ramps up to $V_X$), and $V_{Z2}$ should transition from LOW to HIGH before $V_{Z2}$ is selected by multiplexer 46 as $V_{PWM}$ (when $V_2$ ramps up to $V_X$).

In further embodiments of the present invention, the LOW to HIGH transitions in $V_{Z1}$ and $V_{Z2}$ may be used to form $V_{PWM}$. For example, $V_C$ may be coupled to the inverting inputs of comparators 42 and 44, and $V_1$ and $V_2$ may be coupled to the non-inverting inputs of comparators 42 and 44, respectively. This embodiment of the invention functions the same as circuit 40 except that the polarity of $V_{PWM}$ is inverted. In these embodiments, propagation delays $t_{PLH}$ of comparators 42 and 44 should be substantially constant with respect to each other when $V_1$ and $V_2$ cross $V_C$ between $V_X$ and $V_Y$ to achieve a linear relationship between the duty cycle of $V_{PWM}$ and $V_C$. The LOW to HIGH transitions in $V_{Z1}$ and $V_{Z2}$ may be used to generate the LOW to HIGH transitions in $V_{PWM}$, and the HIGH to LOW and LOW to HIGH transitions in $V_S$ may be used to generate the HIGH to LOW transitions in $V_{PWM}$. Propagation delays $t_{PHL}$ need not be substantially constant with respect to other since the HIGH to LOW transitions of $V_{Z1}$ and $V_{Z2}$ are not used to form $V_{PWM}$.

The duty cycle of $V_{PWM}$ varies between 0% and 100% as $V_C$ varies between $V_X$ and $V_Y$. When $V_C$ equals $V_Y$, the duty cycle of $V_{PWM}$ is 100%. When $V_C$ equals $V_X$, the duty cycle of $V_{PWM}$ is 0%. The duty cycle of $V_{PWM}$ increases as $V_C$ increases, and decreases as $V_C$ decreases. Variations in $V_C$ above $V_Y$ or below $V_X$, in the regions in which the propagation delays $t_{PHL}$ and $t_{PLH}$ of comparators 42 and 44 vary, are ignored by circuit 40.

Waveform signals $V_1$ and $V_2$ may be generated by a single waveform generator or multiple waveform generators. Waveform signals $V_1$ and $V_2$ may, for example, be asymmetrical sawtooth waveforms that have non-rapidly rising edges and rapidly falling edges (e.g., FIG. 5). Alternatively, $V_1$ and $V_2$ may be asymmetrical sawtooth waveforms that have rapidly rising edges and non-rapidly falling edges, or asymmetrical sawtooth waveforms with non-rapidly rising edges and non-rapidly falling edges (e.g., FIG. 6).

Figure 6:
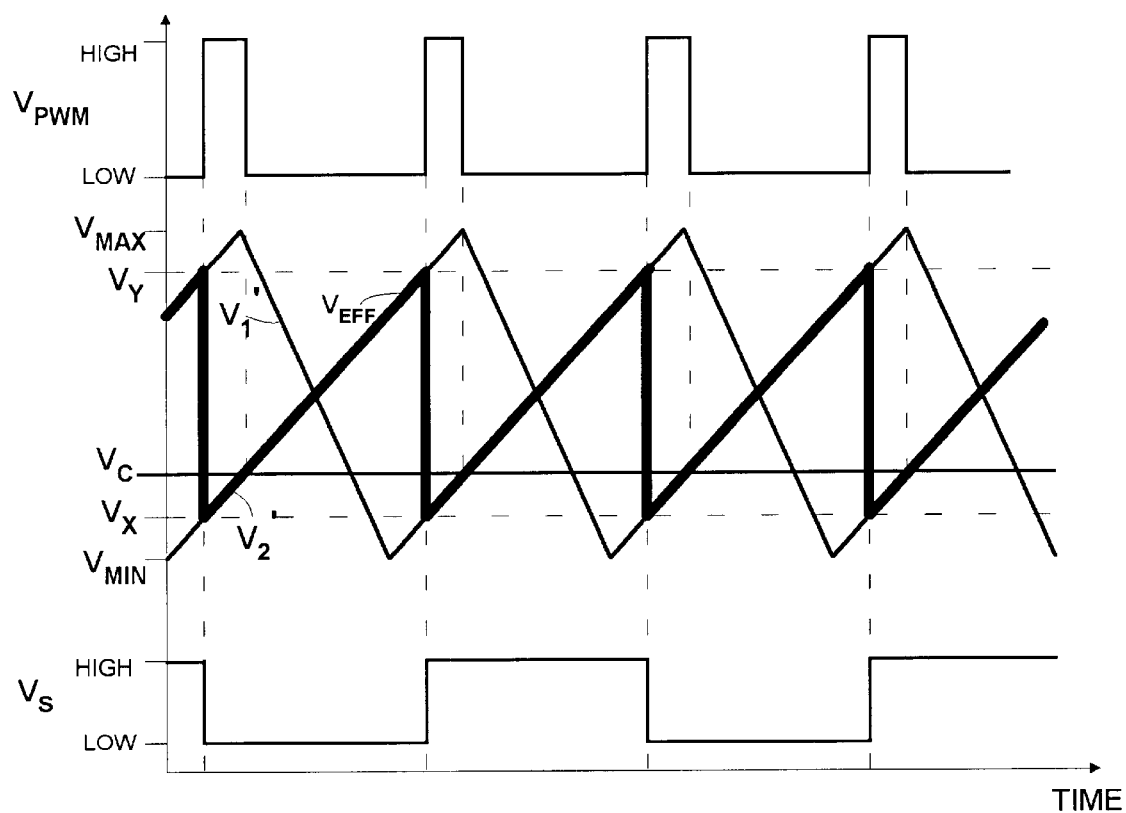
FIG. 6 is another timing diagram of exemplary signals for the circuitry of FIG. 4A.

Asymmetrical sawtooth waveforms with non-rapidly rising and falling edges may be used in circuit 40 as shown, for example, in FIG. 6. FIG. 6 shows examples of signals $V_1'$, $V_2'$, $V_S$, $V_{EFF}$, and $V_{PWM}$. Sawtooth waveforms $V_1'$ or $V_2'$ may be generated by waveform generator 48 in circuit 40. Waveform signals $V_1'$ and $V_2'$ have the same wave shape and the same frequency, but are 180° apart in phase. Comparators 42 and 44 have substantially constant propagation delays $t_{PHL}$ when $V_1$ or $V_2$ crosses $V_C$ between $V_X$ and $V_Y$ since the HIGH to LOW transitions in $V_{Z1}$ and $V_{Z2}$ are used to form $V_{PWM}$. $V_{PWM}$ has a duty cycle that varies linearly with $V_C$ for all duty cycles of $V_{PWM}$.

Figure 7:
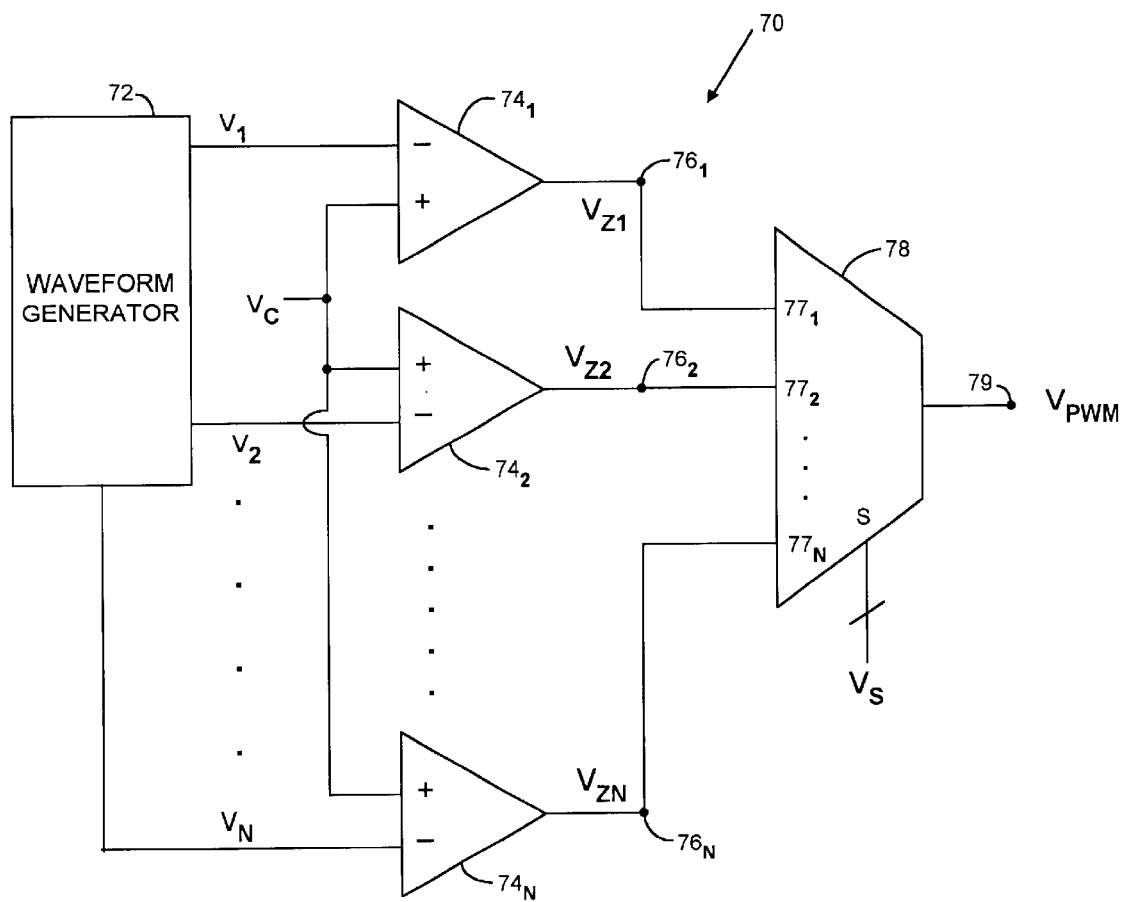
FIG. 7 is a block diagram of another illustrative embodiment of pulse width modulators of the present invention.

Further embodiments of the present invention may include any integer number (greater than one) of comparators and an equal number of periodic waveform signals. FIG. 7 illustrates a pulse-width modulator in accordance with this invention that includes N comparators and a waveform generator that generates N periodic waveform signals. Using more than two comparators and periodic waveform signals causes the pulse width modulator of the present invention to use a narrower region of the peak-to-peak amplitude of each periodic waveform signal to generate $V_{PWM}$. Using a narrower region of the peak-to-peak amplitude of the waveform signals provides for a PWM signal with a duty cycle that varies linearly with $V_C$ for comparators that may have propagation delays $t_{PHL}$ and $t_{PLH}$ that vary significantly except within this narrow region.

Circuit 70 has N comparators ($74_1$, $74_2$, . . . , and $74_N$), waveform generator 72 that generates N periodic waveform signals ($V_1$, $V_2$, . . . , $V_N$), and N-input multiplexer 78. In further embodiments of the present invention, any number of waveform generators may be used to generate N periodic waveform signals at the inputs of N comparators. For example, N waveform generators that each generate a periodic waveform of the same wave shape may be synchronized by a clock signal with N states so that each waveform is 360°/N out of phase from each other.

Waveform generator 72 provides periodic waveform signals $V_1, V_2, \ldots, V_N$ to the inverting inputs of comparators $74_1, 74_2, \ldots, 74_N$. $V_C$ is coupled to the non-inverting inputs of comparators $74_1, 74_2, \ldots, 74_N$. Comparators $74_1, 74_2, \ldots, 74_N$ provide signals $V_{Z1}, V_{Z2}, \ldots, V_{ZN}$, respectively, to inputs $77_1, 77_2, \ldots, 77_N$ of multiplexer 78. Select signal $V_S$ is coupled to the S-input of multiplexer 78. Multiplexer 78 provides $V_{PWM}$ signal at output node 79.

Multiplexer 78 may couple nodes $76_1, 76_2, \ldots, 76_N$, or other nodes to node 79. Select signal $V_S$ is a periodic signal that indicates to multiplexer 78 when to couple nodes $76_1, 76_2, \ldots, 76_N$, or other nodes to output node 79. Thus, $V_S$ indicates to multiplexer 78 when to select the outputs of one of comparators $74_1, 74_2, \ldots, 74_N$, or other comparators (signals $V_{Z1}, V_{Z2}, \ldots,$ or $V_{ZN}$) as $V_{PWM}$. Multiplexer 78 alternately selects the outputs of comparators $74_1, 74_2, \ldots, 74_N$, and other comparators as $V_{PWM}$ for consecutive time intervals as indicated by $V_S$. In one cycle of $V_S$, $V_{PWM}$ equals $V_{Z1}$, then $V_{Z2}, \ldots,$ and then $V_{ZN}$ for consecutive time intervals. The cycle of $V_S$ repeats periodically. Each of the repeating time intervals during which an output of one of comparators $74_1, 74_2, \ldots, 74_N$, or other comparators is coupled to node 79 corresponds to one cycle of $V_{PWM}$.

Examples of signals $V_1, V_2, \ldots, V_N$ are shown in FIGS. 8–11 for various values N. Signals $V_1, V_2, \ldots V_N$ are periodic waveforms that vary between $V_{MAX}$ and $V_{MIN}$. Waveform signals $V_1, V_2, \ldots V_N$ are 360°/N out of phase with each other. As shown in FIGS. 8–11, signal $V_S$ selects the output of comparator $74_1$ to be $V_{PWM}$ when $V_1$ is between $V_X$ and $V_Y$. Signal $V_S$ selects the output of comparator $74_2$ to be $V_{PWM}$ when $V_2$ is between $V_X$ and $V_Y$. Signal $V_S$ selects the output of comparator $74_N$ to be $V_{PWM}$ when $V_N$ is between $V_X$ and $V_Y$.

Signal $V_S$ preferably does not select the output signal of comparator $74_1, 74_2, \ldots, 74_N$, or other comparators to be $V_{PWM}$ during periods of time when that comparator has varying propagation delays ($t_{PHL}$ and $t_{PLH}$). The comparators of circuit 70 may have varying propagation delays when a comparator's periodic waveform ($V_1, V_2, \ldots,$ or $V_N$) crosses $V_C$ above $V_Y$ or below $V_X$. Circuit 70 provides PWM signal $V_{PWM}$ with a duty cycle that varies linearly with $V_C$ by not using the output signals of the comparators to form $V_{PWM}$ during periods of time when their propagation delays $t_{PHL}$ and $t_{PLH}$ are varying.

Select signal $V_S$ causes multiplexer 78 to select the output signal of a comparator as $V_{PWM}$ for a time interval corresponding to when the periodic waveform signal received by that comparator is between $V_X$ and $V_Y$ so that the duty cycle of $V_{PWM}$ varies linearly with $V_C$. Circuit 70 thereby combines the output signals of all the N comparators to form a composite PWM signal that varies linearly with $V_C$ for all duty cycles of $V_{PWM}$. Signal $V_S$ may be a single signal with at least N states or a multibit digital signal that encodes for at least N different states.

The N periodic waveform signals ($V_1, V_2, \ldots,$ and $V_N$) in circuit 70 may be asymmetrical sawtooth waveforms with rapidly falling edges, asymmetrical sawtooth waveforms with rapidly rising edges (e.g., FIG. 9), or asymmetrical sawtooth waveforms with non-rapidly rising and falling edges. The periodic waveform signals of circuit 70 also may be symmetric triangular waveforms where $N \geq 3$ (e.g., FIG. 8).

Figure 8:
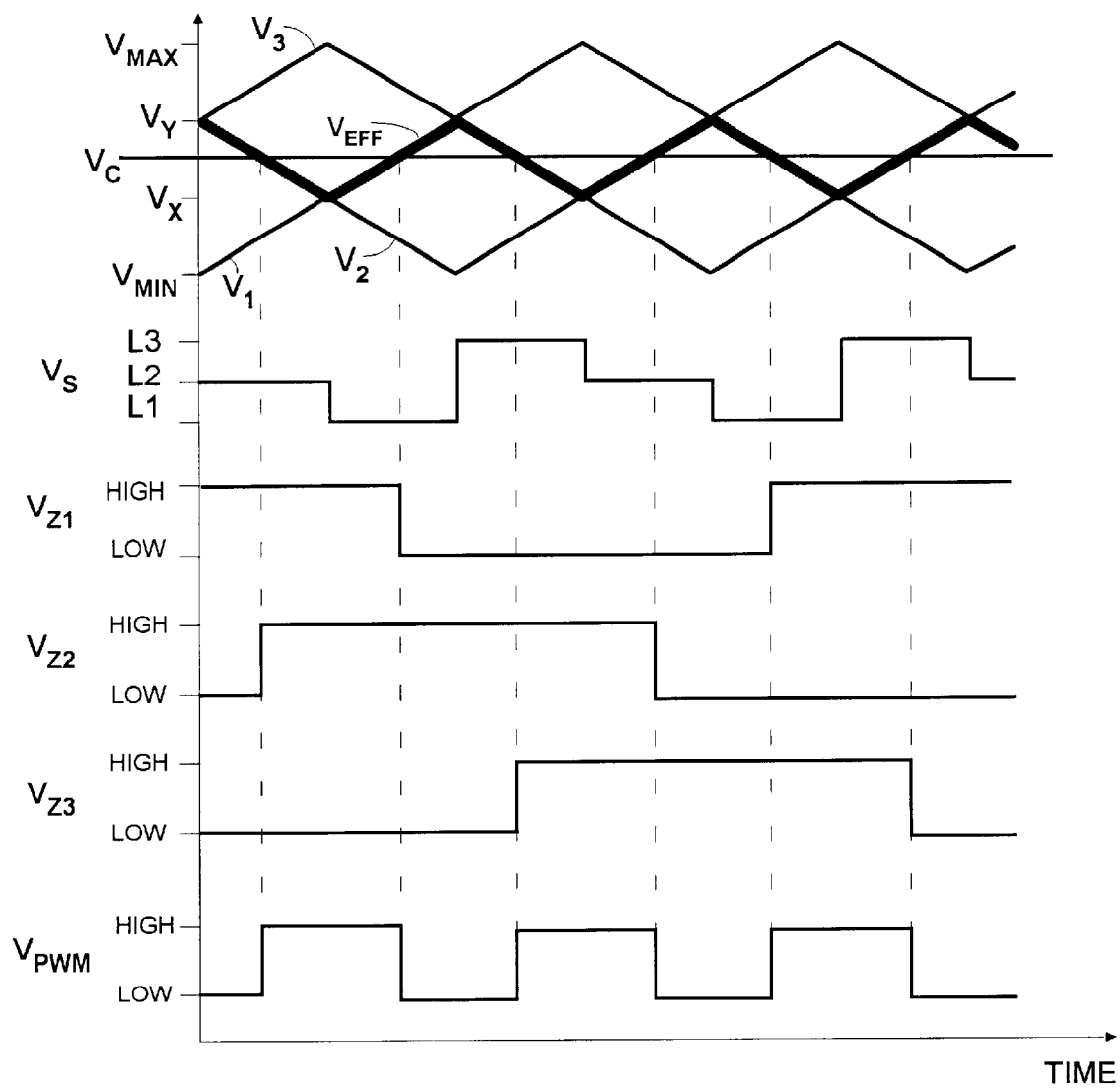
FIG. 8 is a timing diagram of exemplary signals for the circuitry of FIG. 7.

Signals of an embodiment of the present invention using circuit 70 where N=3 are shown in FIG. 8. Circuit 70 may be an N=3 circuit with three comparators $74_1, 74_2,$ and $74_3$ that generate at their outputs signals $V_{Z1}, V_{Z2},$ and $V_{Z3}$, respectively; three periodic waveform signals ($V_1, V_2,$ and $V_3$); and multiplexer 78 that has three inputs coupled to the outputs of each of the comparators. Examples of signals $V_1, V_2, V_3, V_S, V_{Z1}, V_{Z2}, V_{Z3}, V_{EFF},$ and $V_{PWM}$ are shown in FIG. 8. Signals $V_1, V_2,$ and $V_3$ may be, for example, symmetrical triangular waveforms that vary between $V_{MAX}$ and $V_{MIN}$. Signals $V_1, V_2,$ and $V_3$ each have the same wave shape, the same frequency, and a period that is three times the desired period of $V_{PWM}$. Signals $V_1, V_2,$ and $V_3$ are offset with respect to each other by one third of their period so that maximum voltages $V_{MAX}$ occur at equally spaced time intervals. Waveform signals $V_1, V_2,$ and $V_3$ are 120° apart in phase.

Select signal $V_S$ may be, for example, a single signal that has three levels L1, L2, and L3. Signal $V_S$ determines which of signals $V_{Z1}, V_{Z2},$ or $V_{Z3}$ are selected by multiplexer 78 to be $V_{PWM}$ for a given time interval. In the embodiment of FIG. 8, circuit 70 periodically uses each of output signals $V_{Z1}, V_{Z2},$ and $V_{Z3}$ of comparators $74_1, 74_2,$ and $74_3$ to form $V_{PWM}$ when that comparator's corresponding input waveform signal $V_1, V_2,$ and $V_3$ is ramping up or down between $V_X$ and $V_Y$. Signal $V_S$ causes multiplexer 78 to select $V_{Z2}$ as $V_{PWM}$ when $V_S$ equals L2. When $V_S$ equals L2, comparator $74_2$ is in a region of operation such that $V_2$ is ramping up or down between $V_X$ and $V_Y$. Signal $V_S$ causes multiplexer 78 to select $V_{Z1}$ as $V_{PWM}$ when $V_S$ equals L1. When $V_S$ equals L1, comparator $74_1$ is in a region of operation such that $V_1$ is ramping up or down between $V_X$ and $V_Y$. Signal $V_S$ causes multiplexer 78 to select $V_{Z3}$ as $V_{PWM}$ when $V_S$ equals L3. When $V_{PWM}$ equals L3, comparator $74_3$ is in a region of operation such that $V_3$ is ramping up or down between $V_X$ and $V_Y$. Exemplary signal $V_S$ non-sequentially selects $V_{Z2}$, then $V_{Z1}$, then $V_{Z3}$ as $V_{PWM}$ as shown in FIG. 8.

Comparators $74_1, 74_2$ and $74_3$ of circuit 70 may have propagation delays $t_{PHL}$ and $t_{PLH}$ that vary with respect to each other if their corresponding input waveform signals $V_1, V_2,$ or $V_3$ cross $V_C$ below $V_X$ or above $V_Y$, because the output signals of comparators $74_1, 74_2,$ and $74_3$ are not used to form $V_{PWM}$ during these time periods. Circuit 70 does not use variations in $V_C$ above $V_Y$ or below $V_X$ to vary the duty cycle of $V_{PWM}$. Comparators $74_1, 74_2,$ and $74_3$ are selected so that they have substantially constant propagation delays $t_{PLH}$ and $t_{PHL}$ when $V_C$ is between $V_X$ and $V_Y$ since the LOW to HIGH and HIGH to LOW transitions in $V_{Z1}, V_{Z2},$ and $V_{Z3}$ are used to form $V_{PWM}$. Circuit 70 causes the duty cycle of $V_{PWM}$ to vary between 0% and 100% as $V_C$ varies between $V_X$ and $V_Y$.

FIG. 8 shows triangular waveform $V_{EFF}$ which is an effective waveform composed of portions of $V_1, V_2,$ and $V_3$ used to generate $V_{PWM}$. $V_{PWM}$ is LOW when waveform $V_{EFF}$ is above $V_C$, and $V_{PWM}$ is HIGH when waveform $V_{EFF}$ is below $V_C$. The duty cycle of $V_{PWM}$ varies between 0% and 100% as $V_C$ varies between $V_X$ and $V_Y$. When $V_C$ equals $V_Y$, the duty cycle of $V_{PWM}$ is 100%. When $V_C$ equals $V_X$, the duty cycle of $V_{PWM}$ is 0%. The duty cycle of $V_{PWM}$ increases as $V_C$ increases, and decreases as $V_C$ decreases. Variations in $V_C$ above $V_Y$ or below $V_X$ in the regions in which the propagation delays $t_{PHL}$ and $t_{PLH}$ of comparators $74_1, 74_2$ and $74_3$ may vary are ignored by circuit 70.

In a further embodiment of circuit 70, $V_1, V_2,$ and $V_3$ may be triangular waveform signals and signal $V_S$ may sequentially select $V_{Z1}$, then $V_{Z2}$, then $V_{Z3}$ as $V_{PWM}$. In this embodiment, $V_{EFF}$ is a sawtooth waveform with a rapidly falling edge. In this embodiment, only propagation delays $t_{PHL}$ in comparators $74_1$, $74_2$, and $74_3$ need to be substantially constant to achieve a linear relationship between $V_C$ and the duty cycle of $V_{PWM}$.

Figure 9:
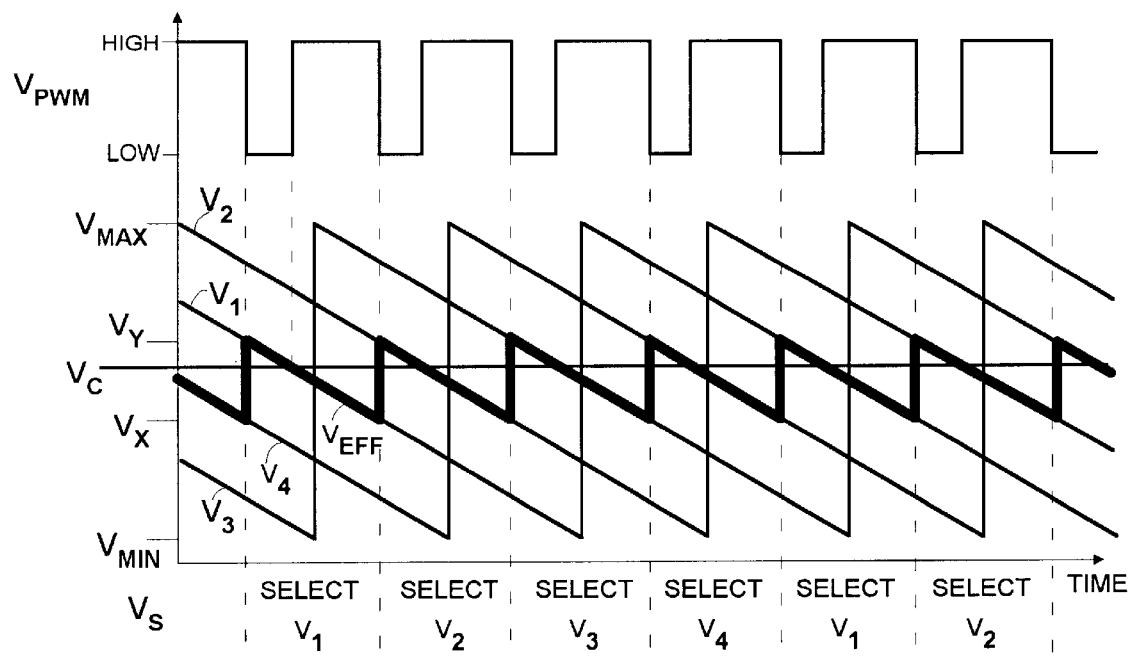
FIG. 9 is another timing diagram of exemplary signals for the circuitry of FIG. 7.

FIG. 9 illustrates examples of four periodic falling edge sawtooth waveform signals $V_1$, $V_2$, $V_3$, and $V_4$, and PWM signal $V_{PWM}$, for circuit 70 with N=4 (FIG. 7). Signals $V_1$, $V_2$, $V_3$, and $V_4$ vary between $V_{MAX}$ and $V_{MIN}$, and each have the same wave shape, the same frequency, and a period that is four times the desired period of $V_{PWM}$. Waveform signals $V_1$, $V_2$, $V_3$, and $V_4$ are 90° apart in phase.

Signals $V_{Z1}$, $V_{Z2}$, $V_{Z3}$, and $V_{Z4}$ of comparators $74_1$, $74_2$, $74_3$, and $74_4$ are sequentially selected by select signal $V_S$ to be $V_{PWM}$ for a time interval (select $V_1$, select $V_2$, select $V_3$, select $V_4$ in FIG. 9) that corresponds to when that comparator's waveform signal input ($V_1$, $V_2$, $V_3$, and $V_4$) ramps down from $V_Y$ to $V_X$. Select signal $V_S$ causes multiplexer 78 to couple the output of a comparator to output node 79 when the periodic waveform signal received by that comparator ramps down to $V_Y$. Multiplexer 78 decouples the output of that comparator from node 79 when the waveform signal received by that comparator ramps down to $V_X$. Waveform signals $V_1$, $V_2$, $V_3$, and $V_4$ are equally spaced in time so that when one periodic waveform ramps down to $V_X$, the next periodic waveform ramps down to $V_Y$.

$V_{EFF}$ is a sawtooth waveform with a rapidly rising edge as shown in FIG. 9. $V_{EFF}$ varies between $V_X$ and $V_Y$. $V_{PWM}$ is LOW when $V_{EFF}$ is above $V_C$ and HIGH when $V_{EFF}$ is below $V_C$.

Comparators $74_1$, $74_2$, $74_3$, and $74_4$ in circuit 70 have substantially constant propagation delays $t_{PLH}$ when the waveform signal coupled to that comparator ramps down from $V_Y$ to $V_X$, since the LOW to HIGH transitions in $V_{Z1}$, $V_{Z2}$, $V_{Z3}$, and $V_{Z4}$ are used to form $V_{PWM}$. The HIGH to LOW transitions in $V_{PWM}$ are formed by the transitions in $V_S$. Therefore, propagation delays $t_{PHL}$ for comparators $74_1$, $74_2$, $74_3$, and $74_4$ do not need to be substantially constant with respect to each other since the HIGH to LOW transitions in $V_{Z1}$, $V_{Z2}$, $V_{Z3}$, and $V_{Z4}$ are not used to form $V_{PWM}$. Each comparator $74_1$, $74_2$, $74_3$, and $74_4$ should have propagation delays $t_{PHL}$ that are less than the time interval between when that comparator's input waveform signal ramps above $V_C$ and when that comparator's output signal is subsequently selected to be $V_{PWM}$. Comparators $74_1$, $74_2$, $74_3$, and $74_4$ may have varying propagation delays when their waveform signals cross $V_C$ above $V_Y$ or below $V_X$.

Using more waveform signals and more comparators in circuit 70 allows the difference in voltage between $V_X$ and $V_Y$ to be decreased. If the comparators used in circuit 70 have substantially constant propagation delays only in a narrow region when $V_C$ cross the waveform signal, the number of comparators and periodic waveform signals in circuit 70 may be increased so that only the linear region of each comparator is used to form $V_{PWM}$. Using more comparators and more waveform signals also provides a PWM signal with a greater frequency without increasing the frequency of the periodic waveform signals. However, increasing the number of comparators and periodic waveforms comes at the expense of added circuitry and power consumption.

Figure 10:
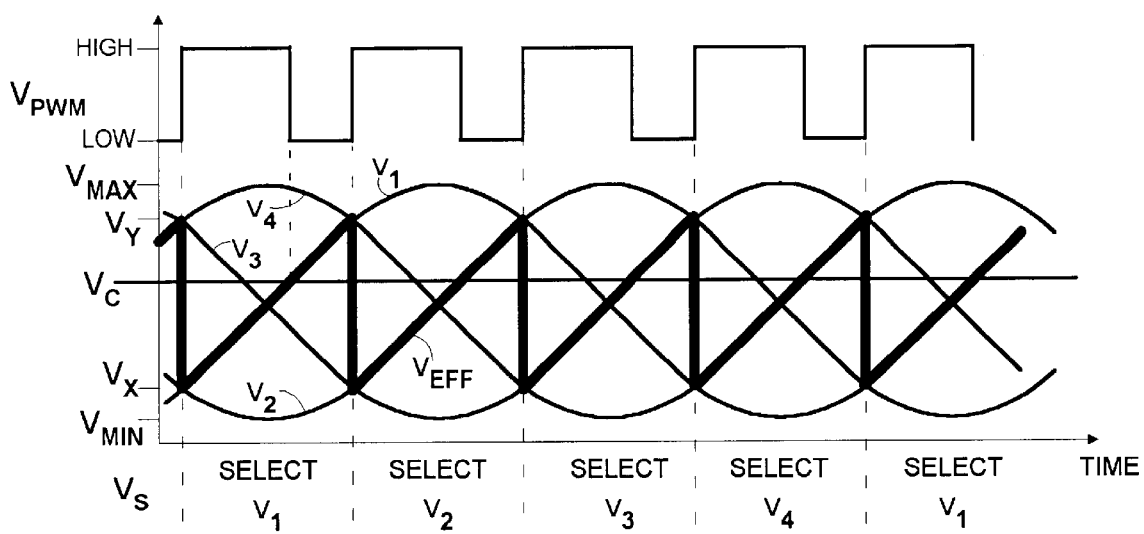
FIG. 10 is another timing diagram of exemplary signals for the circuitry of FIG. 7.

In a further embodiment of the present invention, sinusoidal waveforms may be used as the periodic waveforms as shown in FIG. 10. Sine or cosine waveforms that are substantially linear between $V_Y$ and $V_X$ (such as those shown in FIG. 10) produce a substantially linear PWM signal. FIG. 10 illustrates an example of $V_{PWM}$ obtained using circuit 70 with four sinusoidal waveform signals $V_1$, $V_2$, $V_3$, and $V_4$ and four comparators (N=4). However, any number N of sinusoidal waveforms and comparators may be used with the circuitry of FIG. 7. With respect to FIG. 10, circuit 70 has a waveform generator that provides four sinusoid periodic waveform signals ($V_1$, $V_2$, $V_3$, and $V_4$), four comparators $74_1$, $74_2$, $74_3$, and $74_4$, and four input multiplexer 78. Each waveform signal $V_1$, $V_2$, $V_3$, and $V_4$ has the same wave shape, the same frequency, and a period equal to four times the period of $V_{PWM}$. Waveform signals $V_1$, $V_2$, $V_3$, and $V_4$ are 90° apart in phase.

Select signal $V_S$ determines when a comparator's output signal is selected as $V_{PWM}$. The four select intervals shown in FIG. 10 (select $V_1$, select $V_2$, select $V_3$, and select $V_4$) correspond to the time intervals when each sinusoid determines signal $V_{PWM}$. Select signal $V_S$ causes multiplexer 78 to sequentially couple the output of each of the four comparators to node 79 for the time interval corresponding to when the waveform signal ($V_1$, $V_2$, $V_3$, or $V_4$) received by that comparator is ramping up from $V_X$ to $V_Y$.

In the embodiment of FIG. 10, comparators $74_1$, $74_2$, $74_3$, and $74_4$ are selected so that they have substantially constant propagation delays $t_{PHL}$ when that comparator's waveform signal input crosses $V_C$ as it ramps up from $V_X$ to $V_Y$. The duty cycle of $V_{PWM}$ varies linearly with $V_C$ if the propagation delays $t_{PHL}$ of the comparators are substantially constant when $V_C$ crosses the comparator's waveform signal input ($V_1$, $V_2$, $V_3$, or $V_4$) between $V_X$ and $V_Y$, since the HIGH to LOW transitions in the comparators' output signals ($V_{Z1}$, $V_{Z2}$, $V_{Z3}$, and $V_{Z4}$) are used to form $V_{PWM}$. The LOW to HIGH transitions in $V_{PWM}$ occur at the beginning of each select interval as shown in FIG. 10.

Figure 11:
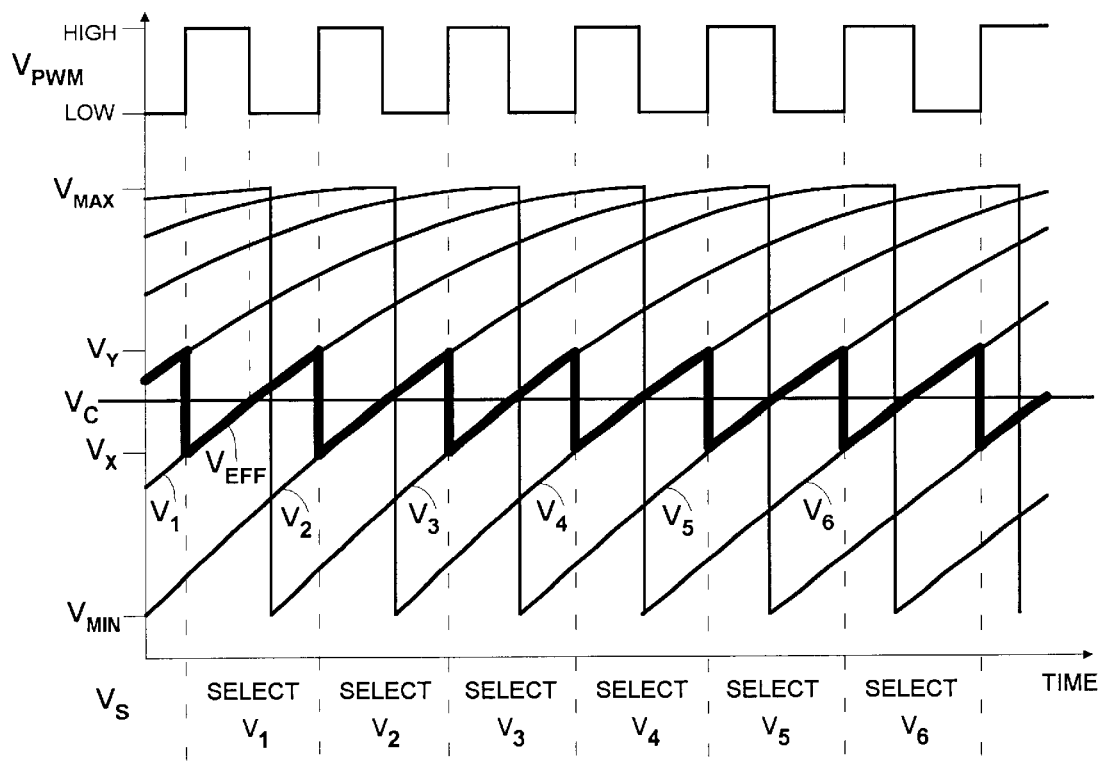
FIG. 11 is another timing diagram of exemplary signals for the circuitry of FIG. 7.

In another embodiment of the present invention, resistor/capacitor (RC) periodic waveform signals may be used to generate signal $V_{PWM}$ as shown in FIG. 11. The RC waveform signals are generated by the ramping up and ramping down of a voltage level on a capacitor that is charged using current conducted through a resistor. With a larger number of waveform signals (e.g., N=6 in circuit 70), only a very narrow band of each RC waveform signal between $V_X$ and $V_Y$ is being used to form signal $V_{PWM}$ as shown in FIG. 11. This narrow band is a relatively linear region of the RC periodic waveform signals. If $V_X$ and $V_Y$ are too far apart, $V_{PWM}$ may have a duty cycle that is undesirably non-linear with respect to $V_C$ due to the curvature in the RC periodic waveform signals.

FIG. 11 illustrates an example of circuit 70 with six rising edge RC periodic waveform signals shown as $V_1$, $V_2$, $V_3$, $V_4$, $V_5$, and $V_6$. However, any number N of RC waveforms and comparators may be used with the circuitry of FIG. 7. Each of waveform signals $V_1$, $V_2$, $V_3$, $V_4$, $V_5$, and $V_6$ in FIG. 11 has the same wave shape, the same frequency, and a period equal to six times the period of $V_{PWM}$. Waveform signals $V_1$, $V_2$, $V_3$, $V_4$, $V_5$, and $V_6$ are 60° apart in phase.

Circuit 70 with N equal to 6 may be used to generate $V_{PWM}$ as shown in FIG. 11. Circuit 70 may have six comparators $74_1$, $74_2$, $74_3$, $74_4$, $74_5$, and $74_6$; a waveform generator that provides 6 periodic waveform signals $V_1$, $V_2$, $V_3$, $V_4$, $V_5$, and $V_6$; and a 6-input multiplexer 78. The output of each comparator is sequentially selected by select signal $V_S$ to be $V_{PWM}$ for a time interval corresponding to when the periodic waveform signal received by that comparator is rising from $V_X$ to $V_Y$ during the corresponding select interval shown in FIG. 11. Each comparator's output signal has substantially constant propagation delays $t_{PHL}$ when it is selected as $V_{PWM}$ by $V_S$, since the HIGH to LOW transitions in the output signals of the comparators ($V_{Z1}$, $V_{Z2}$, $V_{Z3}$, $V_{Z4}$, $V_{Z5}$, and $V_{Z6}$) are used to form $V_{PWM}$. The six select time intervals determined by $V_S$ repeat periodically in the sequence shown in FIG. 11. The LOW to HIGH transitions in $V_{PWM}$ occur at the beginning of each select interval. $V_{EFF}$ is the effective waveform that varies between $V_X$ and $V_Y$.

Persons skilled in the art further will recognize that the circuitry of the present invention may be implemented using circuit configurations other than those shown and discussed above. All such modifications are within the scope of the present invention, which is limited only by the claims which follow.

What is claimed is:

1. A method for providing a pulse-width modulation signal having a duty cycle at a pulse-width modulated output, the method comprising:

coupling a control signal used to vary the duty cycle of the pulse-width modulation signal to a first input node of each of a plurality of N comparator circuits;

coupling a plurality of N periodic waveforms to a second input node of each of the plurality of N comparator circuits, each of the plurality of periodic waveforms having substantially the same wave shape and being 360°/N out of phase from one another;

comparing the control signal to each of the N periodic waveforms using the N comparator circuits to generate N comparator output signals; and multiplexing the N comparator output signals to generate the pulse-width modulation signal.

2. The method defined in claim 1 wherein multiplexing the N comparator output signals further comprises multiplexing the N comparator output signals using a multiplexer circuit having N input nodes coupled to the N comparator output signals and an output node coupled to the pulse-width modulation signal.

3. The method defined in claim 2 wherein combining the N comparator output signals further comprises sequentially coupling the N input nodes of the multiplexer circuit to the output node of the multiplexer circuit.

4. The method defined in claim 2 wherein multiplexing the N comparator output signals further comprises non-sequentially coupling the N input nodes of the multiplexer circuit to the output node of the multiplexer circuit.

5. The method defined in claim 1 wherein the duty cycle of the pulse-width modulation signal is substantially linear with respect to the control signal.

6. The method defined in claim 1 wherein the plurality of N comparators consists of two comparators and N equals 2.

7. The method defined in claim 1 wherein the plurality of N comparators consists of three comparators and N equals 3.

8. The method defined in claim 1 wherein the N periodic waveforms are sinusoidal waveforms.

9. The method defined in claim 1 wherein the N periodic waveforms are RC waveforms.

10. The method defined in claim 1 wherein the N periodic waveforms are sawtooth waveforms.

11. The method defined in claim 1 wherein the N periodic waveforms are triangular waveforms.

12. A method for providing a pulse-width modulation signal at a pulse-width modulator output node, the method comprising:

coupling a first control signal at a first control signal node to a first input node of each of a plurality of N comparator circuits, the N comparator circuits each having a region of operation and an output node;

coupling a plurality of N periodic waveforms to a second input node of a corresponding one of the N comparator circuits, the N periodic waveforms having substantially the same wave shape and being 360°/N out of phase from one another;

coupling the plurality of N output nodes of the comparator circuits to a corresponding one of N input nodes of a multiplexer circuit;

coupling a second control signal to a control signal node of the multiplexer circuit, the second control signal having N states, each state indicating which one of the N comparator circuits operates in the region of operation; and coupling one of the N input nodes of the multiplexer circuit to an output node of the multiplexer circuit based on the state of the second control signal, the output node of the multiplexer circuit being coupled to the pulse-width modulator output node.

13. The method defined in claim 12 wherein coupling one of the N input nodes of the multiplexer circuit to the output node of the multiplexer circuit further comprises sequentially coupling the N input nodes of the multiplexer circuit to the output node of the multiplexer circuit.

14. The method defined in claim 12 wherein coupling one of the N input nodes of the multiplexer circuit to the output node of the multiplexer circuit further comprises non-sequentially coupling the N input nodes of the multiplexer circuit to the output node of the multiplexer circuit.

15. The method defined in claim 12 wherein the plurality of N comparators each have substantially constant propagation delays in their corresponding region of operation.

16. The method defined in claim 12 wherein the plurality of N comparators consists of two comparators and N equals 2.

17. The method defined in claim 12 wherein the plurality of N comparators consists of three comparators and N equals 3.

18. The method defined in claim 12 wherein the N periodic waveforms are sinusoidal waveforms.

19. The method defined in claim 12 wherein the N periodic waveforms are RC waveforms.

20. The method defined in claim 12 wherein the N periodic waveforms are sawtooth waveforms.

21. The method defined in claim 12 wherein the N periodic waveforms are triangular waveforms.

22. A pulse-width modulator circuit that generates a pulse-width modulated signal at a pulse-width modulator output node, from a first and second control signals at first and second control signal nodes, respectively, the second control signal having N states, the pulse-width modulator circuit comprising:

means for generating a plurality of N periodic waveforms at a corresponding plurality of N waveform signal nodes, the N periodic waveforms having substantially the same wave shape and being 360°/N out of phase from one another;

a plurality of N comparators each having a region of operation, a first input coupled to the first control signal node, a second input coupled to a corresponding one of the N waveform signal nodes, and an output signal at a comparator output node; and a multiplexer circuit having N input signal nodes each coupled to a corresponding one of the N comparator output nodes, a multiplexer control node coupled to the second control signal node, and a multiplexer output node coupled to the pulse-width modulator output node, the multiplexer circuit coupling one of the N input signal nodes to the multiplexer output node based on the state of the second control signal indicating that one of the N comparators operates in the region of operation.

23. The circuit defined in claim 22 wherein the multiplexer circuit sequentially couples each one of the N input signal nodes to the multiplexer output node based on the state of the second control signal.

24. The circuit defined in claim 22 wherein the multiplexer circuit non-sequentially couples each one of the N input signal nodes to the multiplexer output node based on the state of the second control signal.

25. The circuit defined in claim 22 wherein the plurality of N comparators each have substantially constant propagation delays in their corresponding region of operation.

26. The circuit defined in claim 22 wherein the plurality of N comparators consists of two comparators and N equals 2.

27. The circuit defined in claim 22 wherein the plurality of N comparators consists of three comparators and N equals 3.

28. The circuit defined in claim 22 wherein the pulse-width modulator circuit is an integrated circuit.

29. The circuit defined in claim 22 wherein the N periodic waveforms are sinusoidal waveform signals.

30. The circuit defined in claim 22 wherein the N periodic waveforms are RC waveform signals.

31. The circuit defined in claim 22 wherein the N periodic waveforms are sawtooth waveform signals.

32. The circuit defined in claim 22 wherein the N periodic waveforms are triangular waveform signals.

33. A pulse-width modulator circuit that generates a pulse-width modulated signal at a pulse-width modulator output node from first and second control signals at first and second control signal nodes, respectively, a plurality of N periodic signals at a corresponding plurality of N signal nodes, the N periodic signals having substantially the same wave shape and being 360°/N out of phase from one another, the second control signal having N states, the pulse-width modulator comprising:

a plurality of N comparators each having a region of operation, a first input coupled to the first control signal node, a second input coupled to a corresponding one of the N signal nodes, and an output signal at a comparator output node; and a multiplexer circuit having N input signal nodes each coupled to a corresponding one of the N comparator output nodes, a multiplexer control node coupled to the second control signal node, and a multiplexer output node coupled to the pulse-width modulator output node, the multiplexer circuit coupling one of the N input signal nodes to the multiplexer output node based on the state of the second control signal indicating that one of the N comparators operates in the region of operation.

34. The circuit defined in claim 33 wherein the multiplexer circuit sequentially couples each one of the N input signal nodes to the multiplexer output node based on the state of the second control signal.

35. The circuit defined in claim 33 wherein the multiplexer circuit non-sequentially couples each one of the N input signal nodes to the multiplexer output node based on the state of the second control signal.

36. The circuit defined in claim 33 wherein the plurality of N comparators each have substantially constant propagation delays in their corresponding region of operation.

37. The circuit defined in claim 33 wherein the plurality of N comparators consists of two comparators and N equals 2.

38. The circuit defined in claim 33 wherein the plurality of N comparators consists of three comparators and N equals 3.

39. The circuit defined in claim 33 wherein the pulse-width modulator circuit is an integrated circuit.

40. The circuit defined in claim 33 wherein the N periodic signals are sinusoidal signals.

41. The circuit defined in claim 33 wherein the N periodic signals are RC signals.

42. The circuit defined in claim 33 wherein the N periodic signals are sawtooth signals.

43. The circuit defined in claim 33 wherein the N periodic signals are triangular signals.

* * * * *

UNITED STATES PATENT AND TRADEMARK OFFICE
CERTIFICATE OF CORRECTION

PATENT NO. : 6,404,251 B1
DATED : June 11, 2002
INVENTOR(S) : David M. Dwelley et al.

It is certified that error appears in the above-identified patent and that said Letters Patent is hereby corrected as shown below:

<u>Title page,</u>
Item [57], ABSTRACT,
Line 9, change "provide" to -- provided --;
Line 12, change "outputs the" to -- outputs of the --;
Line 16, change "in the a" to -- in a --;
Line 19, change "near the its" to -- near its --;

<u>Column 1,</u>
Line 34, change "100" to -- 100 --;

<u>Column 7,</u>
Line 66, change "$\geqq$" to -- $\geq$ --;

<u>Column 8,</u>
Line 34, change "$V_{PWM}$" to -- $V_S$ --.
Line 52, change "$V_{EFF}$" to -- $V_{EFF}$, --.

Signed and Sealed this

Fourth Day of February, 2003

JAMES E. ROGAN
*Director of the United States Patent and Trademark Office*